United States Patent [19]

Griffith

[11] Patent Number: 4,593,723
[45] Date of Patent: Jun. 10, 1986

[54] HEALD CONTROL APPARATUS

[75] Inventor: John D. Griffith, Boldon, England

[73] Assignee: Bonas Machine Company Limited, Sunderland, England

[21] Appl. No.: 585,401

[22] Filed: Mar. 2, 1984

[30] Foreign Application Priority Data

Mar. 11, 1983 [GB] United Kingdom ............... 8306813

[51] Int. Cl.⁴ .......................... D03C 3/06; D03C 3/20
[52] U.S. Cl. ...................................... 139/65; 139/455
[58] Field of Search ................... 139/55.1, 59, 64, 65, 139/68, 455

[56] References Cited

U.S. PATENT DOCUMENTS 3,265,096  8/1966  Zangerle et al. ...................... 139/59
3,529,635  9/1970  Horak ................................... 139/68

FOREIGN PATENT DOCUMENTS 2047755  12/1980  United Kingdom ................. 139/59
2106549   4/1983  United Kingdom ................. 139/59

Primary Examiner—Henry S. Jaudon
Attorney, Agent, or Firm—Robert B. Frailey

[57] ABSTRACT

A heald rod retention device for selectively engaging the terminal end portion of a reciprocating heald rod, the retention device having an electrically activatable magnet for laterally deflecting the terminal end portion from its path of reciprocation, the magnet including north and south poles located side by side and extending along the path of travel of the heald rod so as to create a magnetic flux path across the width of the rod.

10 Claims, 3 Drawing Figures

HEALD CONTROL APPARATUS

The present invention relates to a heald control apparatus for a weaving loom incorporating a jacquard mechanism, in particular but not exclusively, a narrow fabric rapier or needle loom. In such jacquard looms the warp threads are moved up and down by being drawn through eyelets in oscillatable healds, the healds being connected by cords to heald lifting means.

A general aim of the present invention is to provide a jacquard heald control apparatus which can operate reliably at high rates of weft picks per minute.

According to the present invention there is provided a heald rod retention device for selectively engaging the terminal end portion of a reciprocating heald rod, the retention device having an electrically activatable magnet for laterally deflecting the terminal end portion from its path of reciprocation, the magnet including north and south poles located side by side and extending along the path of travel of the heald rod so as to create a magnetic flux path across the width of the rod.

More particularly, there is provided a jacquard heald control apparatus for an open shed jacquard loom characterized in that each heald is controlled by a mechanism which includes a pair of cooperating reciprocal rods connected to a single heald by conventional means including a cord wrapped about a pulley and affixed to the lower ends of the pair of heald rods. A heald rod retention device is located between the two cooperating rods of each pair connected to a single heald. The heald rods operate in pairs, under the influence of the magnet of the retention device, to control a single heald. The rods are moved vertically selectively by means of the usual oscillatable knives mounted on the loom, as is common in this art.

Various aspects of the present invention are hereinafter described with reference to the accompanying drawings, wherein.

Figure 1:
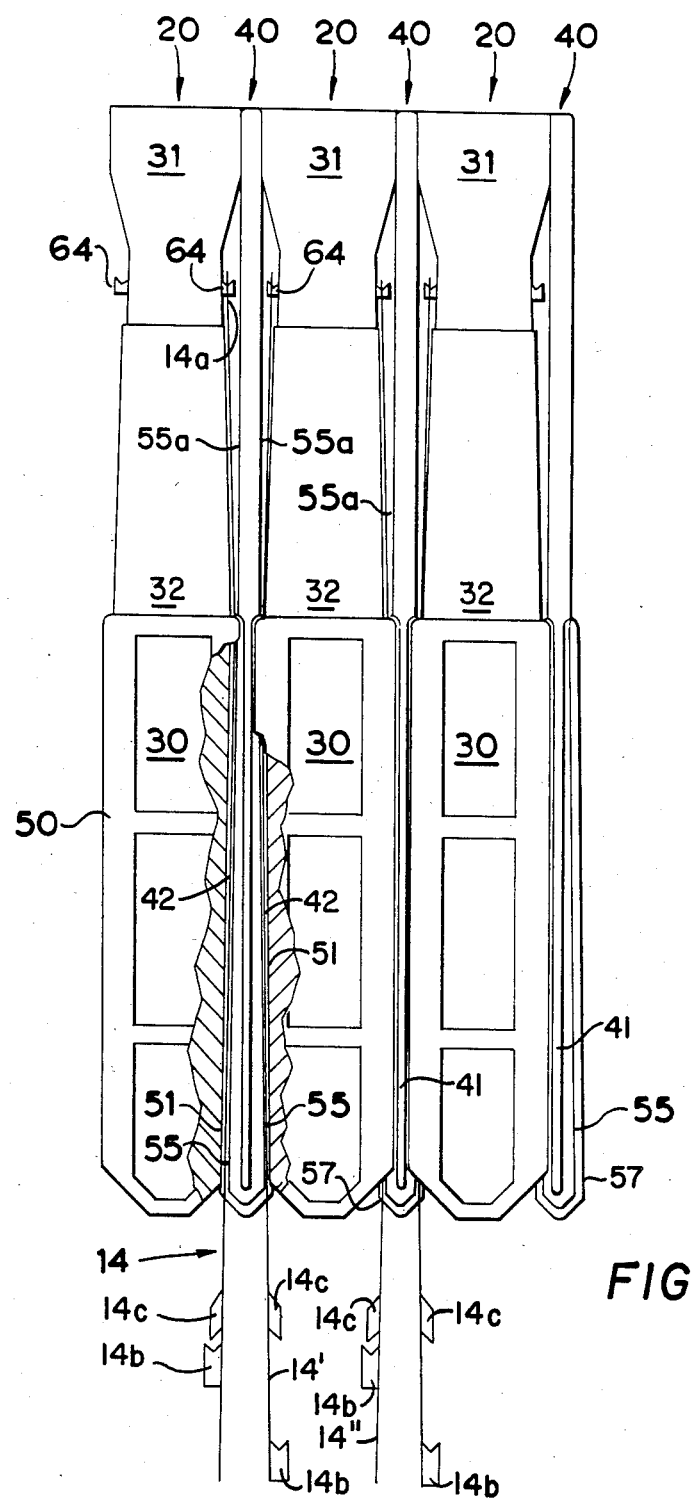
FIG. 1 is a fragmentary view in elevation, partly in section, of a jacquard mechanism showing an arrangement of several side by side heald rod retention devices according to the present invention.

Since jacquard mechanisms for jacquard looms are long and well known in the art, only those parts that cause the up and down movement of the healds are shown in the drawings in order to preserve the simplicity of the Figures.

The operation of the loom of the type to which the present invention particularly relates is described in U.K. Patent No. 2047755 and reference should be made thereto.

Referring first to FIG. 1, there is illustrated an open shed jacquard heald control means for moving a heald (not shown) from an upper to a lower shed position, or vice versa, and for enabling said heald to remain in an upper or lower shed position is required by a selected weaving pattern. It will be understood by those skilled in the art that, in accordance with conventional practice, each heald is connected to a pair of reciprocal heald control rods 14 by conventional mechanism (also not shown) which includes a link connecting the heald to a pulley about which is wrapped a cord having each of its opposite ends affixed to one of the rods of each pair of heald rods.

Each heald is controlled by the pair of heald rods 14 in a similar manner to that described in U.K. Patent No. 2047755 and each rod 14 is provided near its upper terminal end 14a (FIG. 2) with an aperture 38 for selective engagement with a retention device 20. The pair of cooperating heald rods 14 are moved vertically by the usual oscillatable knives or knife means, as is common in the art.

More particularly, each heald rod 14 is reciprocated in a conventional manner by a vertically oscillatable knife 14b which engages with a latch 14c formed on the rod 14. In FIG. 1, the rods 14', 14" constitute the cooperating rods of a single pair and are shown elevated and engaged with their common retention device 20.

Figure 3:
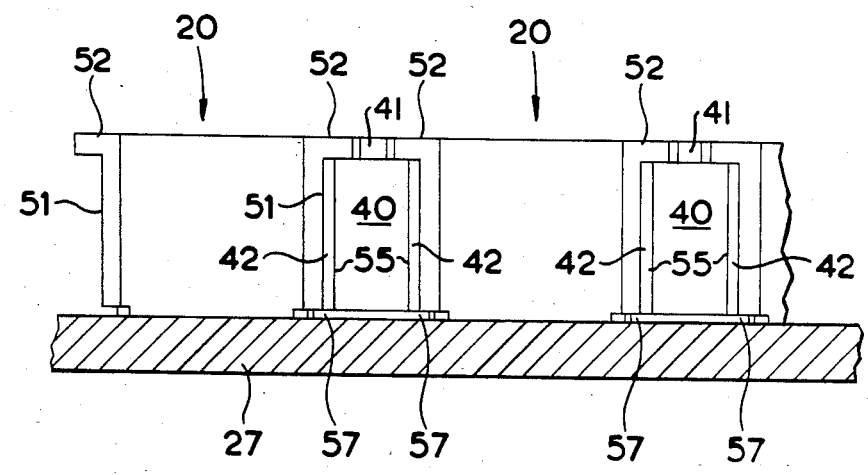
FIG. 3 is a bottom plan view, partly in section, of the arrangement shown in FIG. 1.

A plurality of retention devices 20 are provided arranged in rows and are preferably mounted on a common board 27 (only shown in FIG. 3). Each retention device 20 is arranged to control a given pair of heald rods 14.

Each retention device 20 has basically three discrete portions, a first portion 30 which serves to guide reciprocal movement of the rods 14, a second portion 31 possessing hook formations 64 for holding selected rods 14 in a raised position and an intermediate portion 32 for deflecting selected rods so as to engage with a hook formation 64.

As seen in FIGS. 1 and 3, spacing members 40 are located between neighbouring retention devices 20 for accurately spacing the retention devices 20 from one another. The spacing members 40 preferably extend the full length of the retention devices 20 and the lower portion of the spacing members co-operate with the first portion 30 of the retention devices to define a guide channel 42 for slidably housing each heald rod 14.

Figure 2:
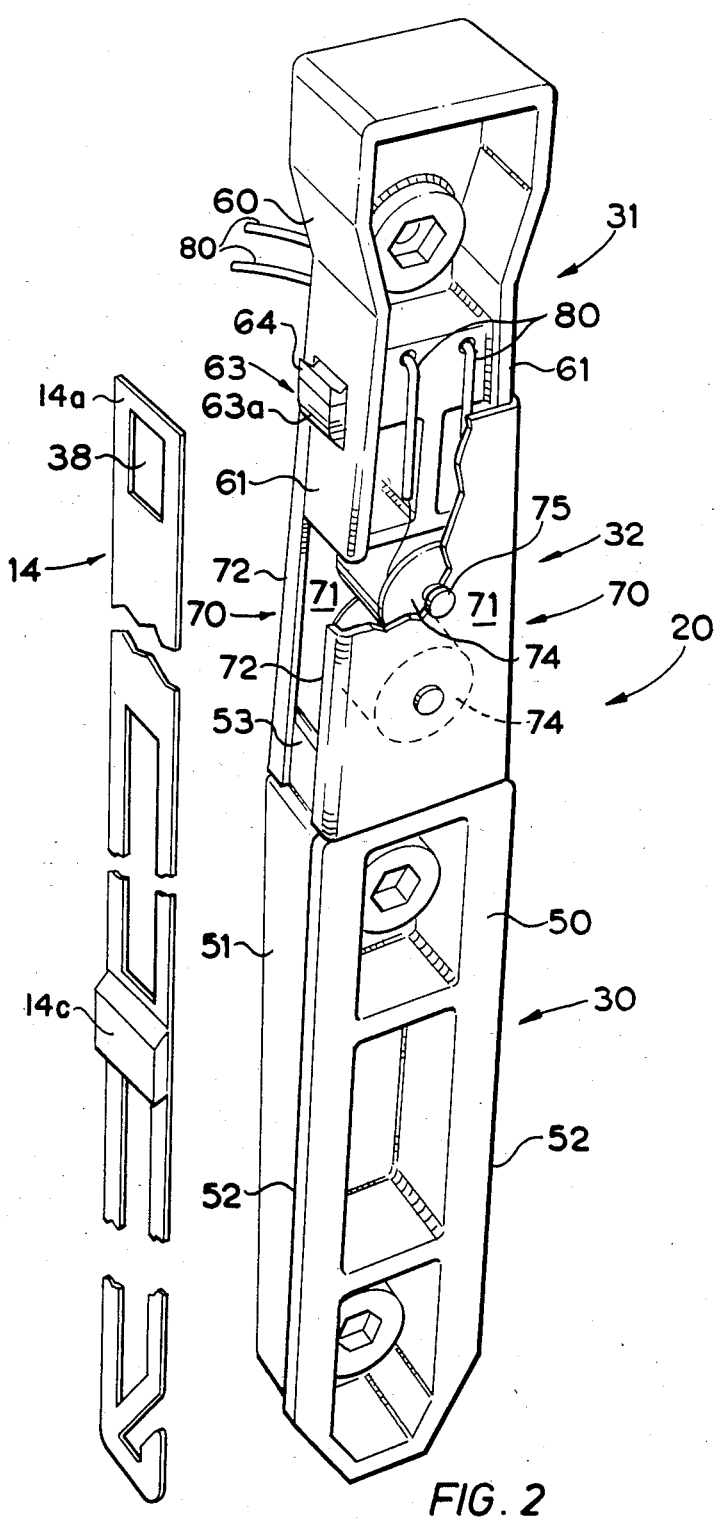
FIG. 2 is an enlarged fragmentary view in perspective, partly broken away, of a heald rod retention device and a heald rod.

The first portion 30 basically comprises a body 50 having longitudinally extending sides defining guide faces 51. The sides also include a longitudinally extending rib 52 which (FIG. 2) extends outwardly toward the neighbouring spacing member 40. As illustrated in FIGS. 1 and 3, the lower portions of the spacing members 40 are provided with centrally located, longitudinally extending ribs 41 to which the ribs 52 of the heald rod retention devices 20 extend in close proximity. At the upper end of body 50 (as seen in FIG. 2) a pair of transversely spaced lugs 53 are provided only one of which is illustrated. Preferably body 50, ribs 52 and lugs 53 are moulded integrally from a suitable plastics material.

The lower region of each spacing member 40 includes a pair of longitudinally extending sides having guide faces 55 which together with guide faces 51 form opposed side faces of each channel 42 (FIG. 2). The spacing members 40 also include longitudinally extending ribs 57 which together with ribs 52 form opposed end faces of channel 42.

The provision of channel 42 enables the upper terminal portion 14a of each rod 14 to be positively guided and supported against excessive lateral deflection during its reciprocation. Accordingly, it is possible to use a thin guage spring steel for forming the rods 14 which is advantageous from a weight point of view.

Preferably, the opposed faces 51, 55 are inclined relative to the longitudinal axis of the retention device so that the channel extends outwardly as its extends from the base of portion 30 towards its top. The upper portions of the spacing members 40, in the region of the second and intermediate portions 31, 32 of the retention devices 20, are rectangular in cross section, and do not include ribs 41, nor ribs 57. The guide faces 55a located on the opposite sides of the upper portion of each spacing member 40 preferably are arranged to extend parallel to the longitudinal axis of the retention device. Accordingly the inclined channel 42 tends to deflect the upper portion 14a of the heald control rod 14 toward face 55a and so causes a slight bending of the rod. This bending action places the rod under tension and thereby stabilises its motion during rapid reciprocation. Preferably the amount of inclination of channel 42 to the longitudinal axis is about 1°.

The second portion 31 preferably comprises a body 60 which is preferably a one piece plastics moulding having a pair of sides 61 which are inclined to one another. A transversely extending bore is provided into which a hook member (not shown) is inserted. The hook member is preferably made of a suitable hard material and has at each end a hook formation 64. Preferably deflection lugs 63 are provided on the body 60 beneath the protruding hook formation 64 of each hook member so as to define a deflection surface 63a for deflecting the upper end 14a of a rod outwardly from the hook member.

The intermediate portion 32 comprises a pair of magnetic pole pieces 70 which are preferably in the form of metal pressings having a planar body portion 71 and marginal portions bent over to form pole strips 72. The strips 72 of each pole piece 70 are inclined so as to converge toward one another in the longitudinal direction as seen in FIGS. 1 and 2.

A pair of solenoids 74 are located between the pole pieces 70 and the solenoids are electrically connected to conventional electronic circuitry (not shown) so that one pole piece forms a south pole and the other a north pole. The circuitry is controlled by a pattern reading means (not shown) in the form of a conventional electronic memory.

Accordingly on either side of each retention device 20 there is provided a north pole strip and a south pole strip which are located side by side and extend along the path of travel of the associated heald rod. The pole strips, which activated, co-operate with the associated rod 14 to locate a magnetic flux path across the width of the rod and thereby create a large area of magnetic attraction between the pole strips and the rod.

The solenoids 74 are secured to the pole pieces 70 by means of rivets 75 which also serve to secure the pole pieces 70 together. The rivets 75 may be an integral part of the solenoid core pieces. The windings of the solenoids are conveniently connected to the electronic circuitry aforesaid by terminal strips 80 which are located in the second portion 31. It will be appreciated that any number of solenoids may be used.

As seen in FIG. 2, the lower portion of second portion 31 is sandwiched between the upper portions of pole pieces 70 so that the hook member is accurately located centrally between the pole pieces 70. Similarly, the lower portions of the pole pieces 70 embrace lugs 53 so that the channel 42 is accurately aligned with the pole strips 72. Accordingly reproducible accuracy in aligning of the channel 42, strips 72 and the hook member are easily achieved during assembly.

In use, the upper portion of a given rod 14 reciprocates across a pair of pole strips 72 located to one side of the associated retention device so that at its uppermost extent of travel its aperture 38 is located above the associated hook formation 64. The normal path of travel of the upper portion of the rod is spaced sufficiently from the hook member so that whilst the solenoids are deactivated the rod remains clear of the associated hook formation.

When it is desired to retain a given rod 14 in its raised position, the solenoids of the associated retention device are activated to deflect the upper rod portion 14a inwards to abut against the pole strips 72.

Since the pole strips are inclined toward an associated hook formation 64, accurate positioning of the upper portion of the rod for its aperture 38 to engage the hook formation is achieved. One or both of the heald rods 14 in a pair of such rods may be deflected against the pole strips 72 for engagement with the two hook formations 64 of their common retention device 20. When both rods 14 of a pair are held on hooks 64, the heald eyelet is located in one shed position. When one or neither rod 14 of the pair is held on a hook 64, the heald eyelet is located in the other shed position.

The pole strips 72 extend along a substantial portion of the upper portion of the rod 14 to maximise the pulling force on the rod 14 so that its upper portion is deflected quickly to abut against the associated pair of pole strips 72. Accordingly, at high speeds the solenoids have to be activated for only a short period of time in order to deflect a given rod into engagement with an associated hook formation 64. This is advantageous as it substantially reduces heat problems associated with the use of solenoids.

I claim:

1. A heald rod retention device for selectively engaging a terminal end portion of a reciprocating heald rod, the retention device having an electrically activatable magnet for laterally deflecting the terminal end portion of the rod from its path of reciprocal travel, the magnet including north and south poles located side by side and extending along the path of travel of the heald rod so as to create a magnetic flux path across the rod, said retention device further including a first portion for guiding reciprocal movement of the heald rod along one longitudinal side thereof, a second portion possessing a hook formation for engaging the heald rod and an intermediate portion between the first and second portions, the intermediate portion including the electrically activatable magnet, the magnet when activated causing the terminal end of the heald rod to be deflected laterally to engage with the hook formation.

2. A device according to claim 1 wherein the magnetic poles are of elongate form and extend from the first portion to the hook formation.

3. A device according to claim 2 wherein the magnetic poles comprise a pair of sheet-like pole pieces each having a planar body portion and marginal portions bent over to form pole strips.

4. A device according to claim 3 wherein the first and second portions are sandwiched between and joined together by said pair of pole pieces.

5. A heald control apparatus including at least one row of a plurality of heald rod retention devices according to any of claims 2 to 4 wherein adjacent retention devices are spaced apart by a spacing member, the spacing member co-operating with the first portion of a neighbouring retention device to define therebetween a guide channel in which a heald rod is received for longitudinal reciprocation.

6. A heald control apparatus according to claim 5 wherein the spacing member has a guide face facing the poles of a neighbouring retention device and the guide channel is inclined to the longitudinal axis of the retention device so that the terminal end of the heald rod is directed onto said guide face to slightly bend the rod and thereby place it under tension during its reciprocation.

7. A heald control apparatus according to claim 6 wherein the angle of inclination between said channel and the longitudinal axis of the retention device is about 1°.

8. A heald control apparatus according to claim 7 wherein the heald rods are formed from a thin gauge spring steel.

9. A heald control apparatus according to claim 8 wherein each retention device co-operates with and is located between a pair of heald rods.

10. A heald control apparatus including at least one row of a plurality of side by side heald rod retention devices for selectively engaging terminal end portions of reciprocal heald rods, each heald rod retention device including a first portion for guiding a heald rod along a path of reciprocation, a second portion possessing a hook formation for engaging the heald rod and an intermediate portion between the first and second portions, the intermediate portion including electrically activatable magnetic poles extending along a portion of the path of reciprocation of the heald rod, the magnetic poles when activated causing the terminal end of the heald rod to be deflected laterally to engage with the hook formation, and spacing members disposed between adjacent heald rod retention devices, each said spacing member having a guide face facing the poles of an adjacent retention device and each said spacing member cooperating with the first portion of said adjacent retention device to define therebetween a guide channel in which a heald rod is disposed for reciprocal movement, said guide channel being inclined relative to the longitudinal axis of the said adjacent retention device whereby, during reciprocation of the heald rod, its terminal end is directed onto said guide face to bend the rod and thereby place it under tension.

* * * * *